(12) United States Patent
Yap et al.

(10) Patent No.: US 10,735,004 B1
(45) Date of Patent: Aug. 4, 2020

(54) LUT-BASED FOCUSED ION BEAM FRIENDLY FILL-CELL DESIGN

(71) Applicant: Microchip Technology Inc., Chandler, AZ (US)

(72) Inventors: Matthew Kian Chin Yap, Bayan Lepas (MY); Alan Nakamoto, Vancouver (CA)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 16/408,096

(22) Filed: May 9, 2019

Related U.S. Application Data

(60) Provisional application No. 62/827,787, filed on Apr. 1, 2019.

(51) Int. Cl.
*H03K 19/20* (2006.01)
*H01J 37/30* (2006.01)
*H03K 19/17748* (2020.01)
*H03K 19/17728* (2020.01)

(52) U.S. Cl.
CPC .......... *H03K 19/20* (2013.01); *H01J 37/3002* (2013.01); *H03K 19/17728* (2013.01); *H03K 19/17748* (2013.01)

(58) Field of Classification Search
None
See application file for complete search history.

(56) References Cited

U.S. PATENT DOCUMENTS

| 5,696,943 | A | * | 12/1997 | Lee | ........................ | G06F 17/505 |
| | | | | | | 714/E11.071 |
| 6,255,845 | B1 | * | 7/2001 | Wong | ................. | H03K 19/1736 |
| | | | | | | 326/101 |
| 2003/0229837 | A1 | | 12/2003 | Cox | | |
| 2017/0093405 | A1 | | 3/2017 | Wang | | |

FOREIGN PATENT DOCUMENTS

EP    2985914 A3    6/2016

OTHER PUBLICATIONS

PCT/US2019/044861, International Search Report and Written Opinion of the International Searching Authority, dated Feb. 14, 2020.
PCT/US19/44861, Invitation to Pay Additional Fees, European Patent Office, dated Nov. 29, 2019.

* cited by examiner

*Primary Examiner* — Jany Richardson
(74) *Attorney, Agent, or Firm* — Glass and Associates; Kenneth Glass; Kenneth D'Alessandro

(57) ABSTRACT

An integrated circuit includes a plurality of logic function circuits disposed on the integrated circuit and interconnected by metal interconnect lines to form a logic network. A plurality of configurable logic function circuits is also disposed on the integrated circuit, each configurable logic function circuit being disposed on a respective area on the integrated circuit and not interconnected by the metal interconnect lines to form the logic network.

7 Claims, 5 Drawing Sheets

LUT-BASED FOCUSED ION BEAM FRIENDLY FILL-CELL DESIGN

The present invention relates to integrated-circuit technology. More particularly, the present invention relates to correction of circuit bugs in circuit networks in an integrated circuit by configuring and connecting into the circuit networks configurable logic circuits disposed on white space areas of the integrated circuit die.

BACKGROUND

Focused Ion Beam (FIB) techniques are increasingly being used in the semiconductor industry. On example of the use of such techniques is in circuit "editing" which allows designers to cut metal traces or add metal interconnections within an integrated circuit die. FIB circuit editing employs a finely focused gallium (Ga+) ion nanoscale resolution beam that has been used to image, etch, and deposit materials on an integrated circuit die with a high level of precision. The FIB process allows designers to cut and connect circuitry within the live device. The high-energy Ga+ ion beam can mill through conductors, and various types of gases can be used to either enhance milling precision or more effectively deposit conductive and dielectric materials. For instance, by utilizing the appropriate gas chemistries, material such as tungsten, platinum, and silicon dioxide can be precisely deposited.

To perform circuit edits, the FIB tool is coupled to a CAD navigation system that is used to locate an area of interest. The FIB circuit editing process employs design files to navigate to the area of interest, allowing subsurface features to be located and ensure that the right edits are made.

Typical FIB integrated circuit editing applications include debugging and optimizing devices in production, exploring and validating design changes, prototyping new devices without the need for mask set fabrication and fabrication runs, scaling fixes, and preventing or at least minimizing time-to-market delays.

In complex integrated circuit design, it is common to find functional bugs during post silicon stage. Logical function fixing typically requires at least a metal respin and in some cases a full base respin. Designers typically treat FIB as a best effort to avoid layout mask respin, and resort to layout mask respin for complicated bugs for which logic cell insertion is needed.

Post silicon stage editing via FIB has limited flexibility as it is destructive by nature. Common successful FIB editing is limited to simple reconnection, and is seldom successful for adding logical functions to repair or alter existing logic functions.

For post-silicon fixes, an approach of spare-gate sprinkling and/or gate-array filler cells are currently offered in the industry. These typically require alteration of the metal interconnect mask used to define the interconnect pattern of one or more metal layers to add new logic cell into silicon, i.e. a metal respin.

BRIEF DESCRIPTION

According to an aspect of the invention, an integrated circuit includes a plurality of logic function circuits disposed on the integrated circuit and interconnected by metal interconnect lines to form a logic network. A plurality of configurable logic function circuits is also disposed on the integrated circuit, each configurable logic function circuit being disposed on a respective area on the integrated circuit and not interconnected by the metal interconnect lines to form the logic network.

According to an aspect of the invention, the configurable logic function circuits each comprise a multiplexer-based lookup table (LUT) having a plurality of inputs. The number of inputs can be four inputs.

According to an aspect of the invention, each multiplexer-based LUT includes a plurality of select inputs and an output.

According to an aspect of the invention, each of the plurality of inputs of each multiplexer-based LUT is connected to a voltage rail in the integrated circuit. According to an aspect of the invention, the voltage rail is a VSS voltage rail.

According to an aspect of the invention a method for performing repair of a logic design error in an integrated circuit including a plurality of logic function circuits disposed on an integrated circuit and interconnected by metal interconnect lines to form a logic network is provided. The method includes providing on the integrated circuit a plurality of configurable logic function circuits, each configurable logic function circuit disposed on a respective area on the integrated circuit and having inputs and outputs not forming a part of the logic network formed from the plurality of logic function circuits, identifying the logic design error by logic type and position on the integrated circuit of the logic function circuit where the design error is located, identifying the location of at least one metal interconnect conductor that must be severed to correct the logic design error, directing a focused ion beam to the location of the at least one metal interconnect conductor and severing the at least one metal interconnect conductor, identifying a configurable logic circuit on the integrated circuit, configuring the identified configurable logic circuit to perform a logic function that corrects the logic type of the logic design error, and connecting the identified configurable logic circuit into the logic network to correct the design error.

BRIEF DESCRIPTION OF THE DRAWING FIGURES

The invention will be explained in more detail in the following with reference to embodiments and to the drawing in which are shown:

Figure 2A:
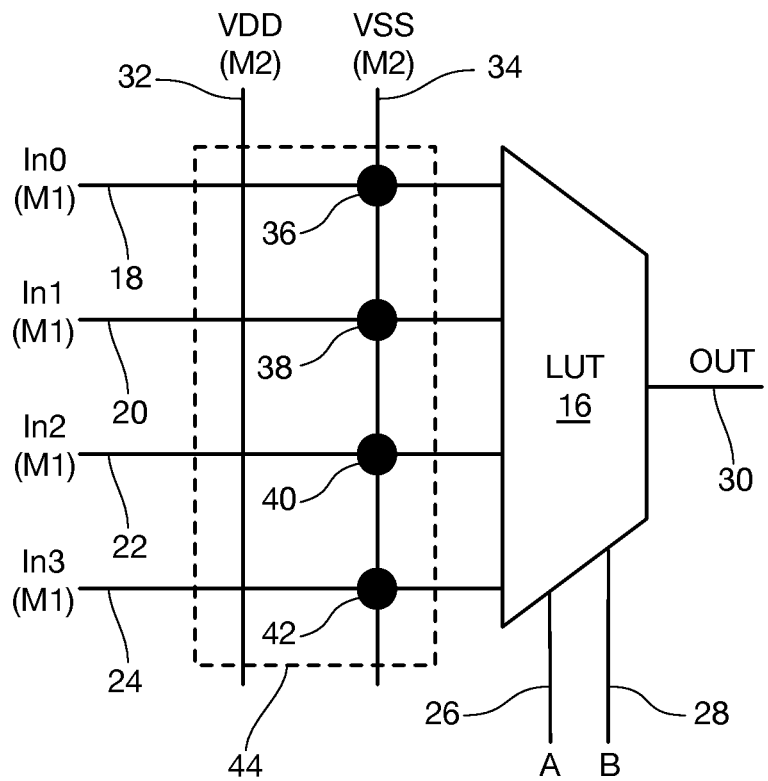
FIG. 2A is a block diagram of a logic circuit in the form of a LUT that may be included in the layout of the integrated circuit of FIG. 1 to occupy a white space area on the integrated circuit die.
Figure 3:
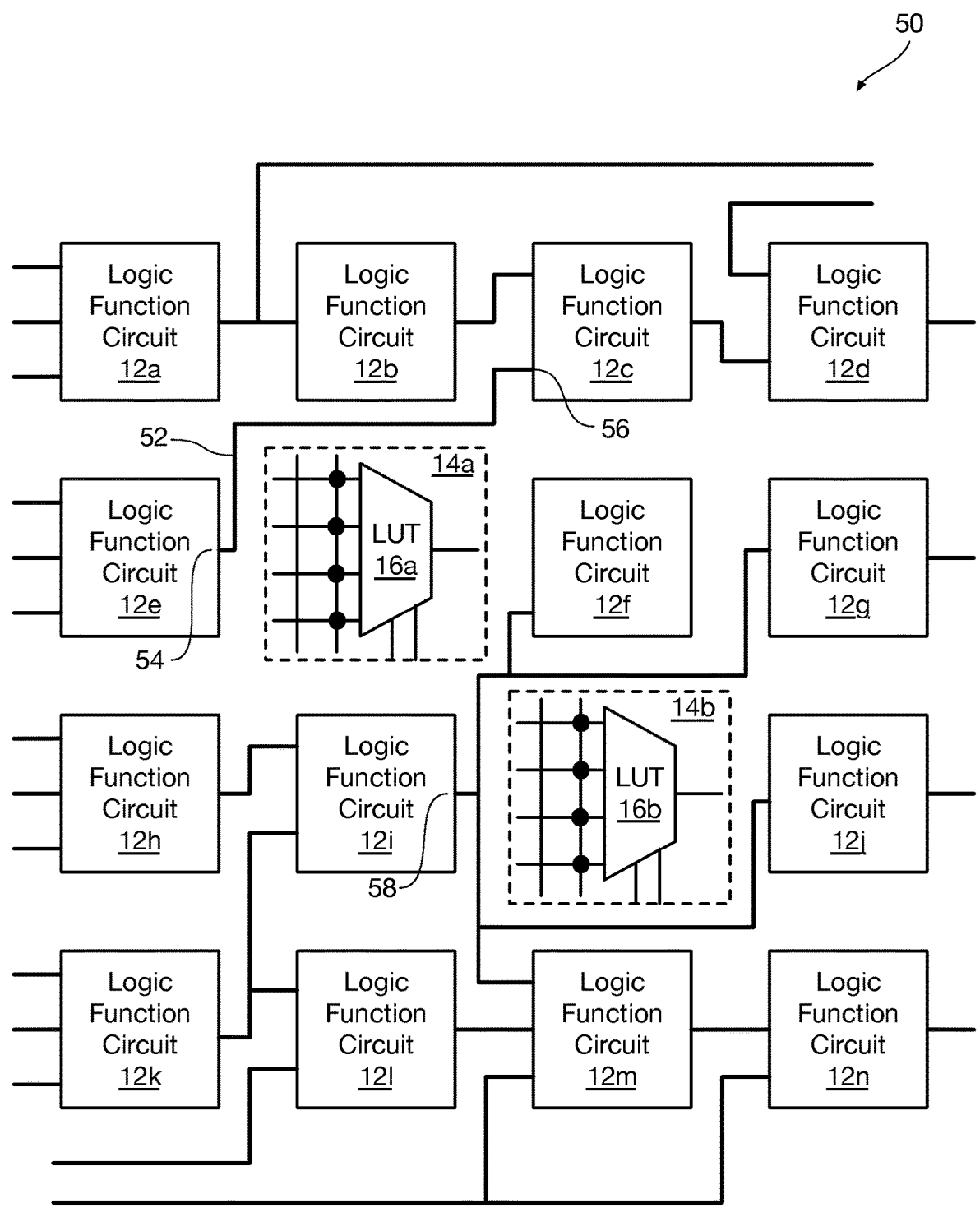
FIG. 3 is a block diagram showing a portion of the integrated circuit die of FIG. 1 further including several of the logic circuits of FIG. 2A included in the white spaces on the integrated circuit die in accordance with an aspect of the present invention.
Figure 4:
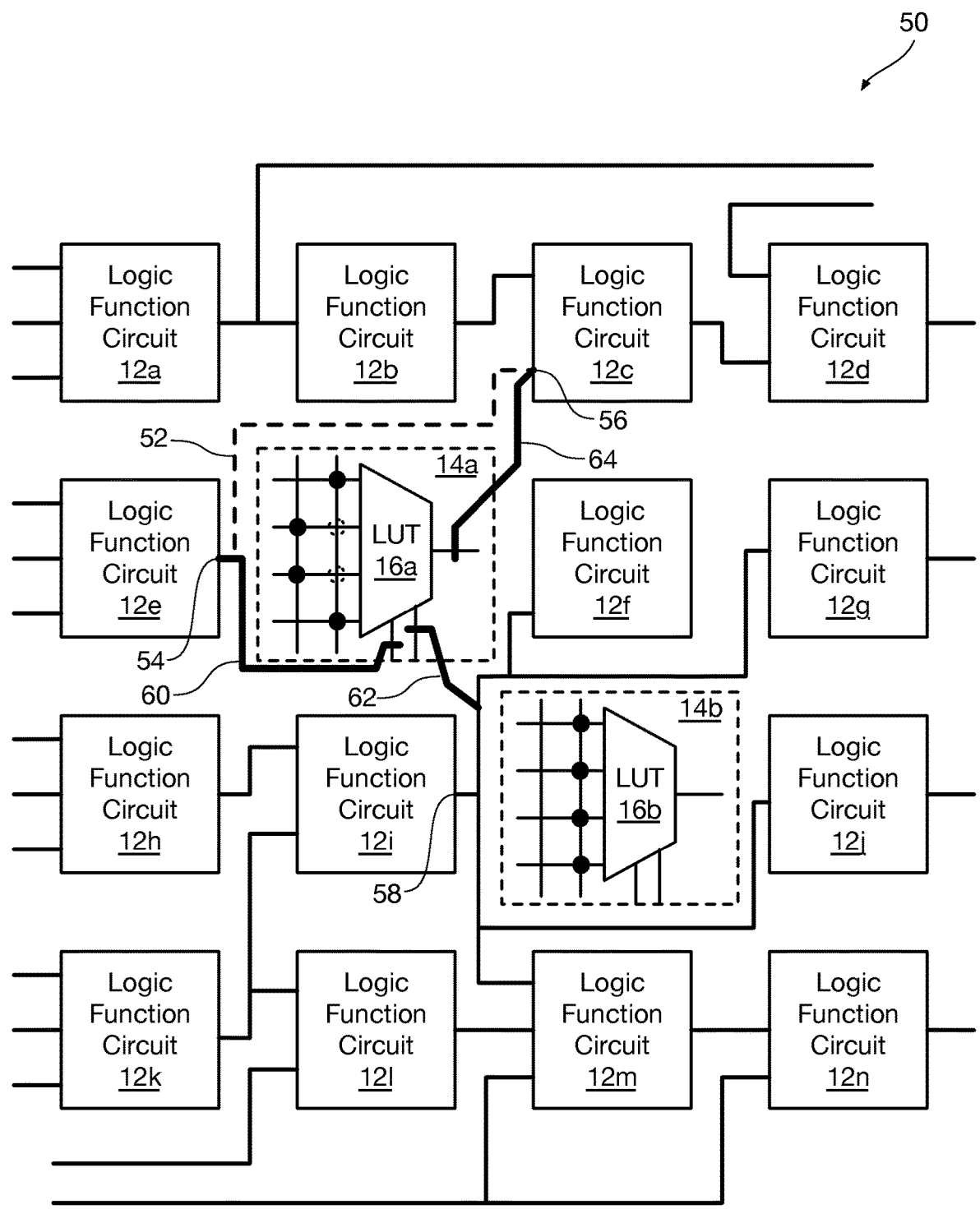
Figure 5:
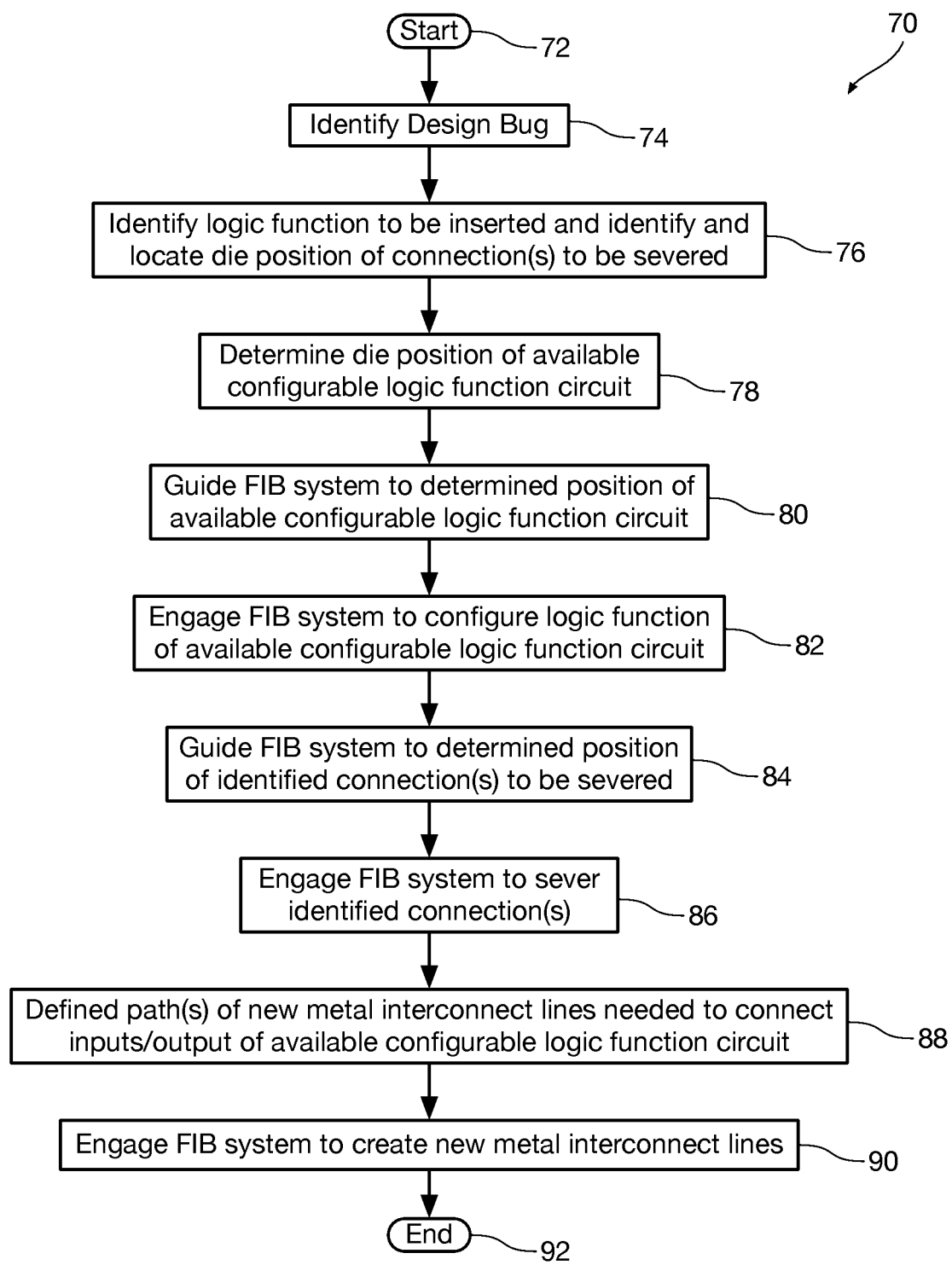

FIG. 4 is a block diagram showing the portion of the integrated circuit die of FIG. 3 wherein one of the logic circuits of FIG. 2A has been configured and connected to the logic network using the FIB techniques in accordance with an aspect of the present invention to correct an error in the logic network implemented in the logic circuit blocks; and FIG. 5 is a flow diagram showing an illustrative circuit error correction method in accordance with an aspect of the present invention.

DETAILED DESCRIPTION

Persons of ordinary skill in the art will realize that the following description is illustrative only and not in any way limiting. Other embodiments will readily suggest themselves to such skilled persons.

Figure 1:
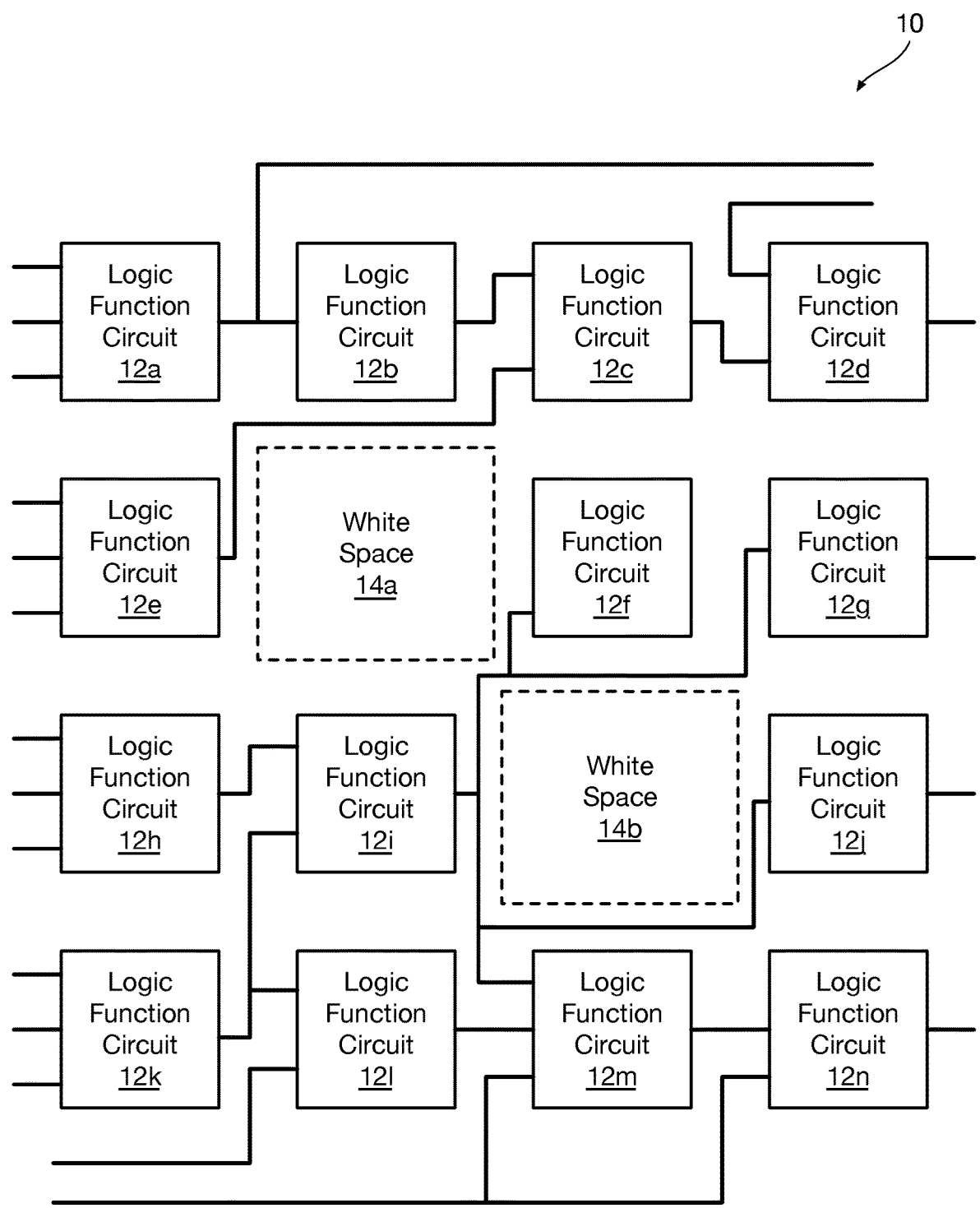
FIG. 1 is a block diagram showing a portion of an integrated circuit die including several logic circuit blocks interconnected to form a logic network and having unoccupied white space remaining on the integrated circuit die between some of the logic circuit blocks.

Referring first of all to FIG. 1, a block diagram of a portion 10 of an integrated circuit formed on a semiconductor die includes several logic function circuits 12a through 12n. The logic function circuits 12a through 12n are interconnected to form a logic network. The metal interconnections between the logic function circuits 12a through 12n are defined by one or more metal masks applied to the integrated circuit during the fabrication process as is known in the art of semiconductor wafer fabrication.

Persons of ordinary skill in the art will appreciate that the several logic function circuits 12a through 12n can take many forms and can be, for example, combinatorial logic function circuits such as simple gates, inverters, lookup tables (LUTs) or can be sequential logic function circuits such as flip-flops, latches, counters or other sequential logic elements. Such skilled persons will also appreciate that the particular interconnect metal wiring shown making connections between the various ones of the logic function circuits 12a through 12n is completely arbitrary and is meant to convey the concepts of the invention and is not meant to represent interconnections to form any particular logic network.

As also depicted in FIG. 1, areas of "white space" are present on the integrated circuit die. As used herein, areas of "white space" on the integrated circuit die are areas in which there are no underlying diffusions in the substrate, or gate areas or metal interconnect lines in layers above the substrate. Up to about 70% of the area of an integrated circuit die is typically occupied by diffusions in the substrate, or gate areas and metal interconnect lines in layers above the substrate, leaving at least 30% of the area of the integrated circuit die as white space.

Figure 2B:
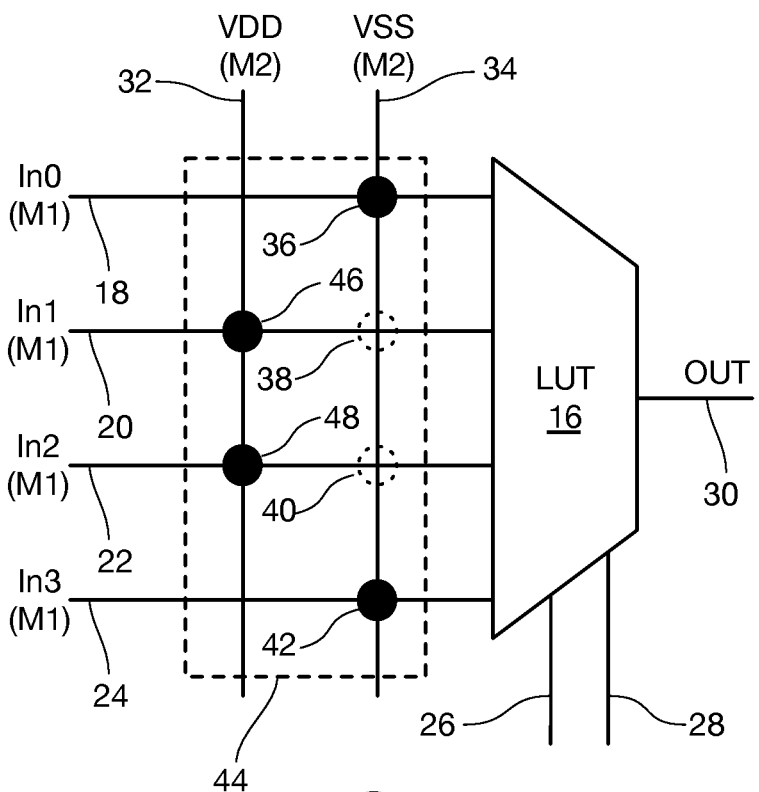
FIG. 2B is a block diagram of the logic circuit of FIG. 2 that has been configured using FIB technology to implement an exclusive-OR gate.

In accordance with an aspect of the invention, logic elements are placed into that white space during layout design, thus at least partially filling the white space with logic elements. While these logic elements may take numerous forms, a particularly useful logic element is a multiplexer-based LUT since it can be configured to implement many different logic functions. An example of such a LUT is depicted in FIG. 2A and FIG. 2B. The LUT 16 shown in FIG. 2A and FIG. 2B is a four-input multiplexer-based LUT, having inputs 18, 20, 22, and 24. The LUT 16 has A and B select inputs 26 and 28 and an output 30. The respective A and B select inputs 26 and 28, and the output 30 are electrically isolated from (i.e., are not electrically connected to) the other logic function circuits on the integrated circuit die. A VDD rail 32 and a VSS rail 34 both form intersections with the inputs 18, 20, 22, and 24. The VDD rail 32 and the VSS rail 34 are shown formed from metal interconnect lines on one metal interconnect layer (shown as metal interconnect layer M2) and the inputs 18, 20, 22, and 24 are shown formed from metal interconnect lines on another metal interconnect layer (shown as metal interconnect layer M1). Persons skilled in the art will appreciate that the choice of metal layers for these lines is somewhat arbitrary.

The LUT 16 in FIG. 2A is shown in an initial state where the inputs 18, 20, 22, and 24 are all tied to the VSS rail 34 by, respectively, metal vias 36, 38, 40, and 42. There are no active devices below the region shown in dashed lines 44. This allows the use of FIB to change the state of the LUT inputs without the possibility of damaging underlying circuit structures due to the destructive nature of the FIB process.

The present invention enables post-silicon logic modification via direct silicon editing. FIG. 2B shows the same LUT 16 after FIB techniques have been used to destroy metal vias 38 and 40 (shown in dashed lines 38 and 40 in FIG. 2B) to disconnect the LUT inputs 20 and 22 from the VSS rail 34 and form intermetal connections 46 and 48 between the LUT inputs 20 and 22 and the VDD rail 32.

In the particular LUT 16 shown in FIGS. 2A and 2B, these illustrative connection changes configure the LUT 16 as an exclusive-OR gate for inputs appearing on A and B select inputs 26 and 28. Persons of ordinary skill in the art will appreciate that the configuration shown in FIG. 2B is merely for purposes of illustration and that any of the available combinations of the voltages presented to the individual inputs of the LUT 16 will result in any of the available logic functions which the LUT 16 can be configured to perform.

As will be appreciated by persons of ordinary skill in the art, the availability of these "spare" white-space logic elements such as LUTs 16 permit a wide range of bug fixes to be made in the integrated circuit without having to reconfigure one or more metal interconnect mask layers. FIG. 3 is a block diagram of a portion 50 of an integrated circuit formed on a semiconductor die which includes several logic function circuits 12a through 12n. The logic function circuits 12a through 12n are interconnected to form a logic network as in the block diagram of FIG. 1.

In the block diagram of the portion 50 of the integrated circuit die of FIG. 3, at least some of the areas of "white space" 14a and 14b of the prior art are instead occupied by LUTs 16a and 16b such as the ones depicted in FIG. 2A in their initial states where the inputs 18, 20, 22, and 24 are all tied to the VSS rail 34 by, respectively, metal vias 36, 38, 40, and 42.

The arrangement of FIG. 3 provides a new bug fix capability. It lowers the cost for post-silicon bug fixes, by allowing confirmation of the fix in silicon without the need for layout mask respin by allowing logic cell formation through tie-off and re-connection that is resilient to lower level destruction during FIB editing. Using the multiplexer-based LUT approach of the present invention, fill design can dedicate die areas for FIB to edit connections of the multiplexer-based LUT input lines to respective VDD/VSS intersections to define a needed logic function for a bug fix. Connections to the multiplexer-based LUT select inputs 26 and 28 and output 30 can be made using known FIB reconnection techniques.

The logic-insertion bug fixes of the present invention can be fairly localized depending on the distribution and sizes of the white spaces on the die of any particular integrated circuit design.

Referring again to FIG. 3, an illustrative and non-limiting example is presented of a circuit design bug for which a fix made possible by use of the present invention. In the example shown in FIG. 3, a metal interconnect line segment 52 is used to connect the output 54 of the logic cell 12e to an input 56 of the logic cell 12c. Suppose that during post-silicon design debug, it has been discovered that this direct connection is an error and that the logic that was intended to be implemented was that the input 56 to the logic cell 12c was supposed to be driven by an exclusive-OR combination of the output 54 of the logic cell 12e and the output 58 of logic cell 12i.

Without the availability of the LUT 16a located in the white space area 14a, not only would one or more metal interconnect layers need to be redefined by metal mask changes, but there might also be a need to incorporate an additional exclusive-OR gate in the circuit design. By using the provisions of the present invention, this bug fix can be made quickly and relatively easily as shown with reference to FIG. 4.

FIG. 4 is a block diagram of the portion 50 of an integrated circuit formed on a semiconductor die showing the bug fix made possible by use of the present invention. In FIG. 4, the vias 38 and 40 (most easily seen in FIG. 2B) have been destroyed by FIB and as indicated by the dashed circles remaining where they once were to delete the connections to the VSS rail 34, and inputs 20 and 22 of LUT 16a have both been connected to the VDD rail 32 using FIB techniques as shown by solid circles 46 and 48. As noted with reference to FIG. 2B, this input reconnection configures the LUT 16a as an exclusive-OR gate.

As shown in FIG. 4, conventional FIB techniques are used to break the metal interconnect line segment 52 (now shown as dashed lines 52). FIB techniques are used to form new metal interconnect line segments. A first new metal interconnect line segment 60 is formed to make a connection between the output 54 of the logic cell 12e and the A select input 26 of the LUT 16a. A second new metal interconnect line segment 62 is formed to make a connection between the output 58 of the logic cell 12i and the B select input 28 of the LUT 16a. A third new metal interconnect line segment 64 is formed to make a connection between the output 30 of the LUT 16a and the input 56 of the logic cell 12c.

Referring now to FIG. 5, a flow diagram shows an illustrative circuit error correction method 70 in accordance with an aspect of the present invention. The method begins at reference numeral 72.

At reference numeral 74, the design bug is identified. At reference numeral 76, the logic function to be inserted is identified and the die position of connection(s) to be severed is located.

At reference numeral 78, the die position of an available configurable logic function circuit is determined. There is no requirement that the selected available configurable logic function circuit actually be nearest, and other available configurable logic function circuits may be utilized without exceeding the scope. At reference numeral 80, the FIB system is guided to the determined position of the available configurable logic function circuit. At reference numeral 82, the FIB system is engaged to configure a logic function of the identified available configurable logic function circuit.

At reference numeral 84, the FIB system is guided to the determined position of the identified connection(s) to be severed. At reference numeral 86, the FIB system is engaged to sever the identified connection(s). At reference numeral 88, the path(s) of new metal interconnect lines that are needed to connect inputs/output of the available configurable logic function circuit are defined. At reference numeral 90, the FIB system is engaged to create the new metal interconnect lines. The method ends at reference numeral 92.

Persons of ordinary skill in the art will appreciate that the order of the sequence of steps used to define the function of the white space logic element and the sequences of steps used to sever the unnecessary connections and define and form the new connections to and from the inputs and outputs of the available configurable logic function circuit and the existing logic network in the integrated circuit die is not important.

The present invention has the advantage that it provides a high likelihood of adding functional logic changes using FIB, enabling editing on a functional failing silicon die without metal respin/re-tapeout. The invention allows confirmation of a bug fix prior to undertaking the expense of providing revised metal masks and fabricating new silicon.

While the present invention has been described with reference to an integrated circuit employing a mask-defined logic network, persons skilled in the art will appreciate that any digital/mixed signal design leveraging ASIC place-and-route implementation approach can apply this design technique for post-silicon bug fix editing.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit comprising:
   a plurality of logic function circuits disposed on the integrated circuit and interconnected by metal interconnect lines to form a logic network;
   a plurality of multiplexer-based lookup tables having a plurality of inputs formed from metal interconnect lines on a first metal interconnect layer, each multiplexer-based lookup table (LUT) disposed on a respective area on the integrated circuit and including a plurality of select inputs and an output, each of the plurality of select inputs and the output being electrically isolated from the plurality of logic function circuits;
   each of the inputs of the multiplexer-based lookup tables forming intersections with a VSS rail formed from metal interconnect lines on a metal interconnect layer different from the first metal interconnect layer, each of the inputs of the multiplexer-based lookup tables connected to the VSS rail at the intersections by metal vias; and
   each of the inputs of the multiplexer-based lookup tables forming intersections with a VDD rail, the VDD rail formed from metal interconnect lines on a metal interconnect layer different from the first metal interconnect layer.

2. The integrated circuit of claim 1 wherein each multiplexer-based LUT includes four inputs.

3. The integrated circuit of claim 1 wherein each of the plurality of inputs of each multiplexer-based LUT is connected to a metal line in the integrated circuit.

4. A method for performing repairing a logic design error in an integrated circuit including a plurality of logic function circuits disposed on an integrated circuit and interconnected by metal interconnect lines to form a logic network, the method comprising:
   providing on the integrated circuit a plurality of multiplexer-based lookup tables having a plurality of inputs formed from metal interconnect lines on a first metal interconnect layer, each multiplexer-based lookup table disposed on a respective area on the integrated circuit and including a plurality of select inputs and an output, each of the plurality of select inputs and the output being electrically isolated from the plurality of logic function circuits, each of the inputs of the multiplexer-based lookup tables forming intersections with a VSS rail formed from metal interconnect lines on a metal interconnect layer different from the first metal interconnect layer, each of the inputs of the multiplexer-based lookup tables connected to the VSS rail at the intersections by metal vias, each of the inputs of the multiplexer-based lookup tables forming intersections with a VDD rail, the VDD rail formed from metal interconnect lines on a metal interconnect layer different from the first metal interconnect layer;

identifying the logic design error by logic type and position on the integrated circuit of the logic function circuit where the deign error is located;

identifying the location of at least one metal interconnect conductor that must be severed to correct the logic design error;

directing a focused ion beam to the location of the at least one metal interconnect conductor and severing the at least one metal interconnect conductor;

identifying a multiplexer-based lookup table having a location nearest to the logic function circuit where the design error is located;

configuring the identified multiplexer-based lookup table to perform a logic function that corrects the logic type of the logic design error; and connecting the identified multiplexer-based lookup table into the logic network to correct the design error.

5. The method of claim 4 wherein configuring the identified multiplexer-based lookup table to perform the logic function that corrects the logic type of the logic design error comprises:

selectively destroying selected ones of the metal vias to disconnect selected ones of the plurality of inputs from the VSS rail; and reconnecting the disconnected ones of the plurality of inputs to the VDD rail.

6. The method of claim 5 wherein destroying selected ones of the metal vias to disconnect selected ones of the plurality of inputs from the VSS rail comprises using a focused ion beam to destroy the metal vias connecting the ones of the plurality of inputs to the first metal line.

7. The method of claim 4 wherein:

the multiplexer-based lookup table has at least one select input and one output; and connecting the identified configurable logic circuit into the logic network to correct the design error comprises connecting the multiplexer-based LUT into the logic network in place of the severed at least one metal interconnect conductor.

* * * * *